(12) United States Patent
Weiss et al.

(10) Patent No.: US 7,416,443 B2
(45) Date of Patent: Aug. 26, 2008

(54) COAXIAL COUPLING FOR STEPLESS CALIBRATION

(75) Inventors: Frank Weiss, Bernsdorf (DE); Reiner Oppelt, Ainring (DE); Gerhard Nestler, Wurmannsquick (DE)

(73) Assignee: Rosenberger Hochfrequenztechnik GmbH & Co KG, Fridolfing (DE)

( * ) Notice: Subject to any disclaimer, the term of this patent is extended or adjusted under 35 U.S.C. 154(b) by 0 days.

(21) Appl. No.: 11/574,209

(22) PCT Filed: Jul. 26, 2005

(86) PCT No.: PCT/EP2005/008112

§ 371 (c)(1),
(2), (4) Date: Mar. 21, 2007

(87) PCT Pub. No.: WO2006/021280

PCT Pub. Date: Mar. 2, 2006

(65) Prior Publication Data

US 2007/0218755 A1   Sep. 20, 2007

(30) Foreign Application Priority Data

Aug. 25, 2004   (DE) .................. 20 2004 013 305 U (51) Int. Cl.
*H01R 9/05* (2006.01)
(52) U.S. Cl. .................................................. 439/578
(58) Field of Classification Search ......... 439/578–585, 439/394, 63, 638, 502, 284, 320; 324/754, 324/692, 600, 72.5, 601, 538, 415; 333/260, 333/243, 245, 601
See application file for complete search history.

(56) References Cited

U.S. PATENT DOCUMENTS 4,967,173 A * 10/1990 Watson ..................... 333/260
6,997,753 B2 * 2/2006 Broomall et al. ............ 439/638

FOREIGN PATENT DOCUMENTS

DE    39 12 795 A1   11/1989
DE    102 11 334 A1   9/2003

* cited by examiner

*Primary Examiner*—Edwin A. León
(74) *Attorney, Agent, or Firm*—DeLio & Peterson, LLC; Robert Curcio

(57) ABSTRACT

A coaxial plug or coaxial socket connected to a coaxial coupler of a device that is to be calibrated, such as a measuring port of a vectorial network analyzer (VNA). The coaxial coupler has an inner conductor part and a coaxial outer conductor part, and has a short-circuit connection provided between the inner conductor part and the outer conductor part. The outer conductor part and the inner conductor part are connected to a contact coupling sleeve so that they can be axially displaced in relation to one another. A contact mechanism is located and configured to act selectively on the contact coupling sleeve, so that the latter creates the short-circuit connection in the form of a detachable electrical contact between the inner conductor part and the outer conductor part, whilst at the same time mechanically fixing the inner conductor part and the outer conductor part in their relative positions.

20 Claims, 5 Drawing Sheets

COAXIAL COUPLING FOR STEPLESS CALIBRATION

BACKGROUND OF THE INVENTION

1. Field of the Invention

The present invention relates to a calibration standard in the form of a coaxial coupling comprising a coaxial airline, in particular a coaxial plug or a coaxial socket for connecting to a coaxial coupling of a device to be calibrated. More specifically, the present invention relates to a measuring port of a vectorial network analyzer (VNA), wherein a coaxial coupling comprises an inner conductor part and an outer conductor part arranged coaxially therewith and a short-circuit connection provided between the inner conductor part and the outer conductor part.

2. Description of Related Art

The high level of accuracy of vectorial network analyzers (VNA) is based thereon that the network analyzer is calibrated before the actual measurement of the value and phase of the complex reflection coefficient by connecting calibration standards to its measuring ports. There now exist several different calibration methods. Most of the calibration methods use "open", "short" and "match" calibration standards for system calibration. By connecting these calibration standards to the measuring ports of the network analyzer, the errors arising in the network analyzer that lead to a deviation of the measurement values from the true value can be determined and, during subsequent object measurement, used for computational error correction. This is disclosed, for example, in DE 39 12 795 A1. However, these previously usual calibration methods are still not sufficiently accurate. In order to determine the remaining uncertainty in the directivity and measuring port matching, it is proposed in EA guidelines that a precision coaxial airline which has a defined incorrect termination or short-circuit at its output should be connected to the measuring port of the previously system-calibrated network analyzer to be tested and the reflection coefficients at the input of this airline should be measured at a series of measuring points within a defined frequency range of the network analyzer (EA-10/12, EA Guidelines on the Evaluation of Vector Network Analyzers (VNA), European Co-operation for Accreditation, May 2000). According to these guidelines, it is only the ripple amplitude of the oscillations superimposed on the value of the reflection coefficients that is evaluated, although by way of simplification, it is assumed that this ripple amplitude is approximately identical with the effective source port match, although this only applies when the effective directivity is ignored. This known verification regulation, making use of a precision airline is therefore relatively inaccurate and does not enable a precise estimation of the measuring uncertainty that is to be expected, let alone any subsequent correction of the error correction terms for source port matching.

DE 102 11 334 A1 discloses a method for measuring the effective directivity and/or the effective source port match of a measuring port of a system-calibrated vectorial network analyzer, whereby a precision airline short-circuited at the output is connected and the complex reflection coefficient is measured at the input of this precision airline with a series of measuring points within a predefined frequency range. The effective directivity of the series of measured complex reflection coefficients is subjected to a discrete Fourier transform and the base band is filtered out of the resultant spectrum. By means of an inverse Fourier transform, the series of effective directivity values is obtained.

The calibration standard required for measurements of this type in the form of the short-circuited precision airline is matched to the corresponding coaxial coupling on the device to be calibrated. Coaxial couplings are usually designed such that, on plugging together, they abut one another with the respective outer conductors before the inner conductors abut one another at their end faces, in order to avoid damage within the coaxial coupling. The contact plane between the mutually abutting outer conductors is designated the reference plane. In the case of coaxial couplings made precisely to measure, due to component tolerances, it would be possible for the inner conductor of plug and socket to abut one another earlier than the outer conductors. If the plug and socket are then pushed further together with suitable force in order to permit the outer conductors also to contact one another at their end faces, the coaxial coupling suffers damage in the region of the respective inner conductors. It is therefore usual to design the plug and the socket with different separations of the end face of the inner conductor contact from the outer conductor contact plane (reference plane), so that when the outer conductors contact one another, a separation (offset) remains between the end faces of the inner conductors of the plug and the socket. An offset of this type is, for example, $2/100$ mm to $3/100$ mm. This protects the plug connection against damage due to forces between the inner conductors.

However, in the aforementioned calibration method, this offset affects the measurement result in an undesirably negative manner or falsifies them in an unforeseeable way and therefore diminishes the accuracy. It is therefore desirable to have a calibration standard available wherein the offset of the coaxial plug connection between the device to be calibrated and the plugged-in calibration standard can be adjusted to zero. For this purpose, the inner conductor of the calibration standard would have to be designed displaceable relative to the outer conductor of the calibration standard. Particularly in the case of the calibration standard in the form of the short-circuited precision airline, however, the short-circuit connection between the inner conductor and the outer conductor is a potential error source if it is not carried out exactly. Therefore, in the calibration standard of the "short" type, this connection is designed to be fixed and not detachable.

SUMMARY OF THE INVENTION

Bearing in mind the problems and deficiencies of the prior art, it is therefore an object of the present invention to improve a calibration standard with regard to its field of use and calibration accuracy.

It is another object of the present invention to provide a calibration standard where the offset of the coaxial plug connection between the device to be calibrated and the plugged-in calibration standard can be adjusted to zero.

Still other objects and advantages of the invention will in part be obvious and will in part be apparent from the specification.

This aim is achieved according to the invention with a calibration standard of the aforementioned type having the characterizing features as described in the claims. The above and other objects, which will be apparent to those skilled in the art, are achieved in the present invention which is directed to a coaxial coupling comprising a coaxial airline, having a coaxial plug or a coaxial socket for connecting to a coaxial coupling of a device to be calibrated, wherein the coaxial coupling comprises: an inner conductor part and an outer conductor part arranged coaxially therewith, having a short-circuit connection provided between the inner conductor part and the outer conductor part; a contact coupling sleeve provided on which the outer conductor part and the inner conductor part are fixed axially displaceable relative to one another, characterizing the connection; and a contact mechanism arranged and designed such that the contact mechanism optionally acts on the contact coupling sleeve so that the contact coupling sleeve creates the short-circuit connection in the form of a detachable electrical contact between the inner conductor part and the outer contact part, and simultaneously mechanically fixes the inner conductor part and the outer conductor part in their position relative to one another.

In a second aspect, the present invention is directed to a method for calibrating a device having a coaxial coupling connection comprising: determining an offset between an end face of an inner conductor part of the coaxial coupling and a reference plane or end face of an outer conductor part of the coaxial coupling at a coaxial plug or coaxial socket of the device to be calibrated; connecting an offset gauge to the coaxial plug or coaxial socket; rotating an adjusting screw until a predetermined offset is set at the coaxial coupling or until the offset gauge shows the predetermined offset; rotating a fastening nut or coupling ring until, through an axial advancing thereof, a compression ring presses contact surfaces of the coaxial coupling segments through inclined surfaces, radially against a contact surface of an annular collar of the inner conductor part; forming a short-circuit connection between the inner conductor part and the outer conductor part by a contact coupling sleeve; and creating a mechanically firm connection between the contact coupling sleeve and the adjusting screw or inner conductor part.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-10 of the drawings in which like numerals refer to like features of the invention.

It is provided in the calibration standard of the aforementioned type that a contact coupling sleeve is provided on which the outer conductor part and the inner conductor part are fixed axially displaceable relative to one another, wherein a contact mechanism is arranged and designed such that said contact mechanism optionally acts on the contact coupling sleeve so that the contact coupling sleeve creates the short-circuit connection in the form of a detachable electrical contact between the inner conductor part and the outer conductor part and simultaneously mechanically fixes the inner conductor part and the outer conductor part in their position relative to one another.

This has the advantage that, due to the detachable short-circuit between the inner conductor part and the outer conductor part in conjunction with the adjustment mechanism, for a precisely adjustable offset between the inner conductor and the reference plane (end face contact surface of the outer conductor) of the coaxial coupling of the calibration standard, a high qualitatively precision measuring means is available which is adjustable to any desired offsets between the end face contact surfaces of the outer conductor and the inner conductor on the coaxial coupling of the device to be calibrated, and also compensates for component tolerances in the offset, that is, a gap between the end face contact surface of the inner conductor of the coaxial coupling of the device to be calibrated and the end face contact surface of the inner conductor of the coaxial coupling of the calibration standard is minimized or eliminated regardless of the predetermined distances of the inner conductor from the reference plane and the component tolerances, so that a measuring error due to the offset in the coaxial couplings of the device to be calibrated and the calibration standard is minimized or eliminated.

In a preferred embodiment, the contact coupling sleeve is designed to be radially elastically deformable over a predetermined axial contact range and having at least one contact surface and is undetachably mechanically connected to the outer conductor part such that it is undetachably electrically conducting, whereby the inner conductor part has a contact surface which, with the inner conductor part mounted, faces toward the at least one contact surface in the region of the radially elastically deformable axial contact region of the contact coupling sleeve and wherein the contact mechanism is arranged and designed such that, in order to create the electrical contact between the inner conductor part and the outer conductor part, the contact mechanism optionally radially elastically deforms the contact coupling sleeve and presses at least one contact surface in the region of the radially elastically deformable axial contact region of the contact coupling sleeve with suitable contact force against the contact surface of the inner conductor part. The contact surface on the inner conductor part is designed, for example, as an annular collar.

Radial deformability of the axial contact region is thereby achieved, for example, that in the axial contact region the contact coupling sleeve has at least two slits running in the axial direction, which are preferably evenly spaced from one another in the peripheral direction.

In a preferred embodiment, in the region of at least one contact surface of the axial region of the contact coupling sleeve, the axial contact region of the contact coupling sleeve has at least one inclined surface elevated radially above the outer periphery of the contact coupling sleeve, wherein the contact mechanism comprises a coupling ring which is detachable from the contact coupling sleeve by means of a screw thread engagement between an external thread on the contact coupling sleeve and an internal thread on the coupling ring, and is fastened to the contact coupling sleeve, movable in the axial direction by a screw motion relative to the contact coupling sleeve, wherein the coupling ring has a stop surface which is arranged and designed such that, on screwing the coupling ring onto the contact coupling sleeve, the stop surface, in cooperation with at least one inclined surface of the axial contact region of the contact coupling sleeve, elastically deforms the contact coupling sleeve radially inwardly in the axial contact region and presses at least one contact surface of the axial contact region of the contact coupling sleeve against the contact surface of the inner conductor part.

The axial contact region of the contact coupling sleeve has, for example, at least one pair of inclined surfaces lying mutually diametrically opposed, to which are assigned a pair of correspondingly opposed contact surfaces on an internal side of the contact coupling sleeve.

Suitably, the inclined surfaces are arranged evenly spaced from one another in the peripheral direction.

In order to minimize torsion forces acting on the contact coupling sleeve and their conduction onto the inner conductor part during screwing on and tightening of the coupling ring, arranged between at least one inclined surface of the axial contact region of the contact coupling sleeve and the stop surface of the coupling ring is a compression ring, which transmits an axially directed force of the stop surface of the coupling ring onto at least one inclined surface of the axial contact region of the contact coupling sleeve.

A precisely defined sliding contact in the form of a linear contact extending as a circular line in the peripheral direction between the inside of the compression ring and at least one inclined surface of the axial section of the contact coupling sleeve is thereby achieved that an internal surface of the compression ring facing towards the at least one inclined surface of the axial contact section of the contact coupling sleeve is formed with a rounding, so that an internal diameter of the compression ring increases from an end of the compression ring facing towards the stop surface of the coupling ring to an end of the compression ring facing towards the at least one inclined surface of the axial contact region of the contact coupling sleeve.

A mechanically particularly reliable construction, which is simultaneously economical to manufacture and assemble, is thereby achieved that the outer conductor part and the inner conductor part are attached to a clamping sleeve at an internal periphery of the clamping sleeve.

By way of example, the fastening between the contact coupling sleeve and the inner conductor part is designed as a screw engagement between an external thread on the inner conductor part and an internal thread on the contact coupling sleeve.

Thereby that the internal thread is formed on the contact coupling sleeve in the region of the slit axial contact region of the contact coupling sleeve, with the coupling ring tightened, a mechanical fixing is produced not only in the region of the pressed-together contact surfaces of the inner conductor part and the contact coupling sleeve, but also by a mechanical frictional engagement in the region of the screw thread engagement between the inner conductor part and the contact coupling sleeve. In this way, the mechanical and electrical connection between the inner conductor part and the contact coupling sleeve are separated, so that the short-circuit connection between the outer conductor part and the inner conductor part via the contact coupling sleeve is free from possibly varying mechanical loads, which would impair the quality and precision of the short-circuit connection.

Figures 1, 2:
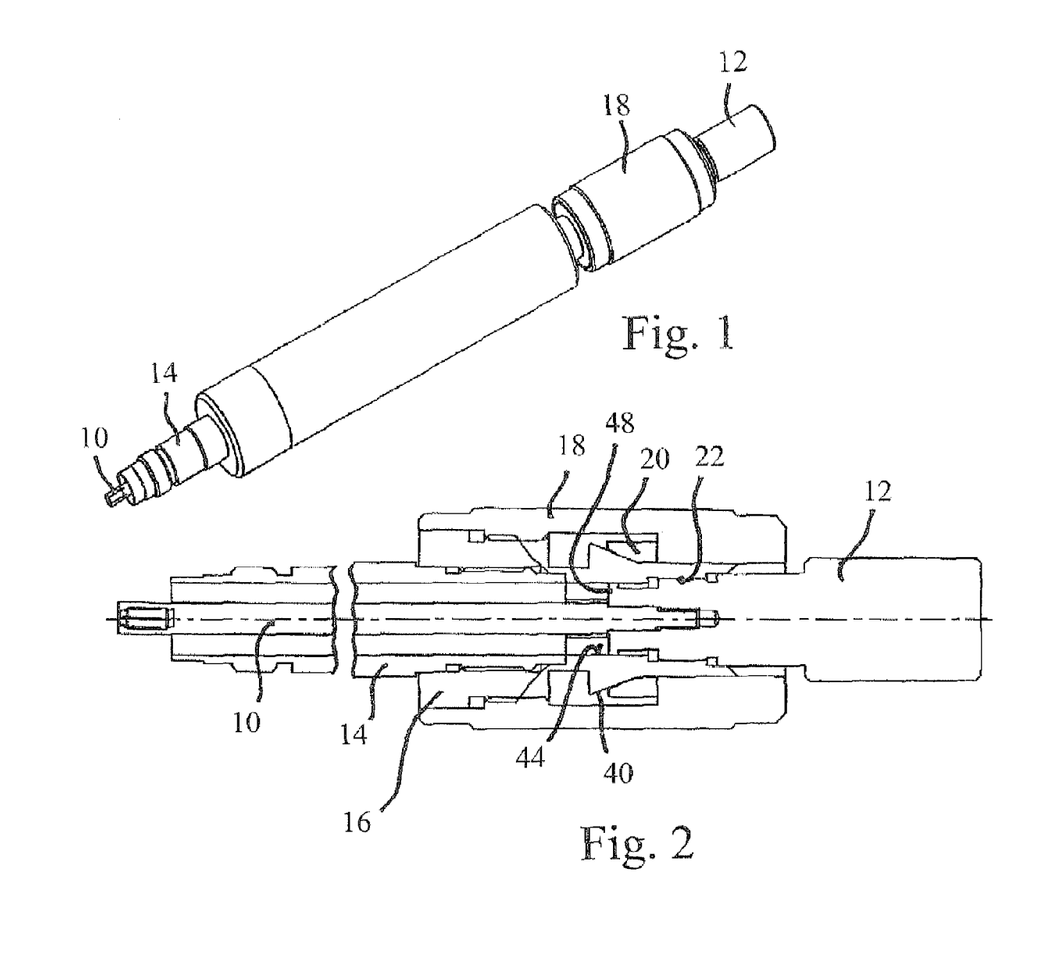
FIG. 1 shows a preferred embodiment of a calibration standard according to the invention in the form of a coaxial socket in a perspective view.
FIG. 2 shows the calibration standard of FIG. 1 in a sectional view.
Figures 3, 4:
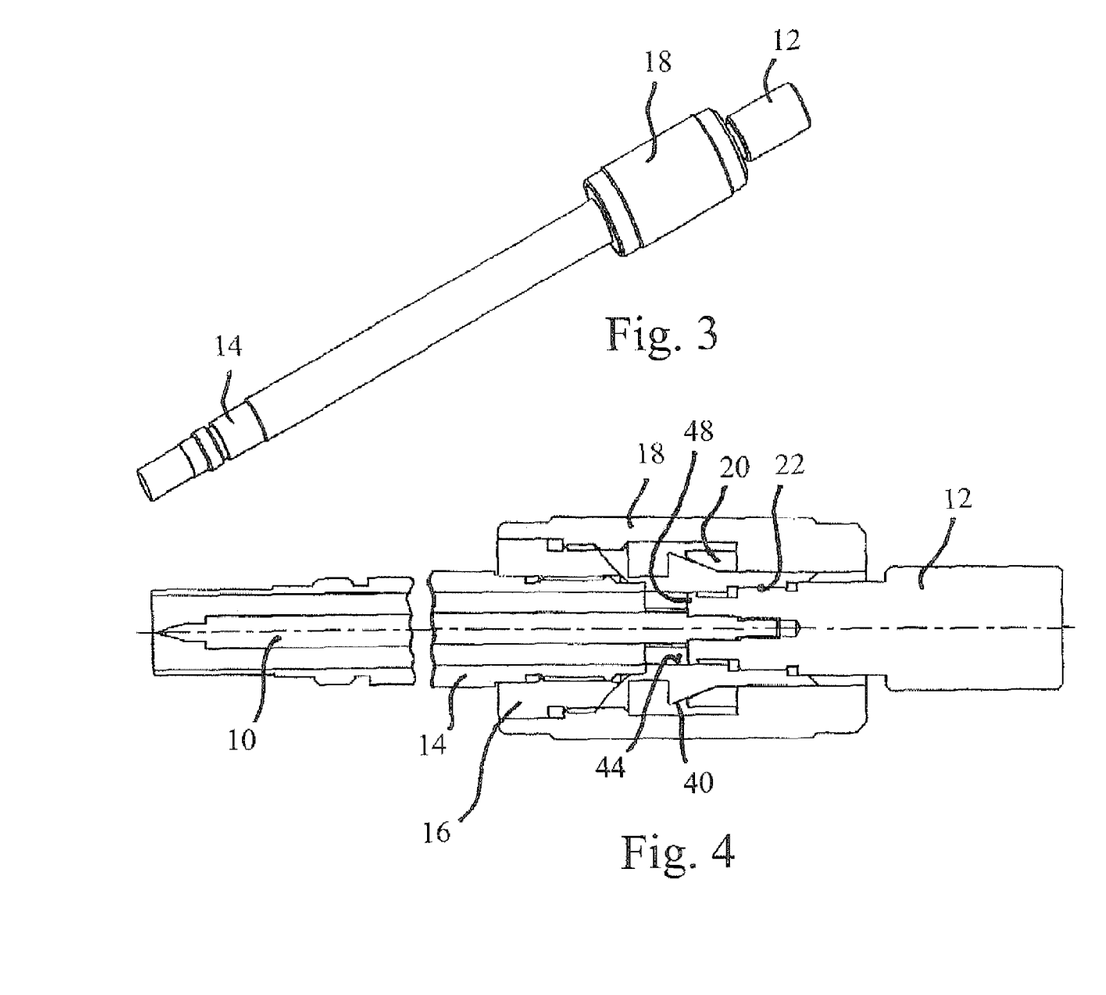
FIG. 3 shows a preferred embodiment of a calibration standard according to the invention in the form of a coaxial plug in a perspective view.
FIG. 4 shows the calibration standard of FIG. 3 in a sectional view.

FIGS. 1 to 4 illustrate a preferred embodiment of the calibration standard according to the invention as a coaxial socket (FIGS. 1 and 2) and as a coaxial plug (FIGS. 3 and 4), which is also designated an "offset short" and, as can be seen, in particular, from FIGS. 2 and 4, comprises the following: an inner conductor part 10 with an adjusting screw 12, an outer conductor part 14, a contact coupling sleeve 16, a fastening screw or a fastening nut or coupling ring 18 and a compression ring 20. The outer conductor part 14 and the contact coupling sleeve 16 form a fixed unit. The inner conductor part 10 and the adjusting screw 12 also form a fixed unit, whereby in the embodiment shown, the inner conductor part 10 and the adjusting screw 12 are screwed together. The inner conductor part 10 is connected at 22 to the contact coupling sleeve 16 by means of a screw thread engagement (in the sectional representation of FIGS. 2 and 4, not visible) between an external thread on the adjusting screw 12 and an internal thread on the contact coupling sleeve 16 whereby, through twisting the adjusting screw 12, the inner conductor part 10 is movable axially relative to the outer conductor part 14. By this means, an offset, that is, a distance between the end face of the inner conductor part and an end face of the outer conductor part (the reference plane) can be steplessly set.

Figure 5:
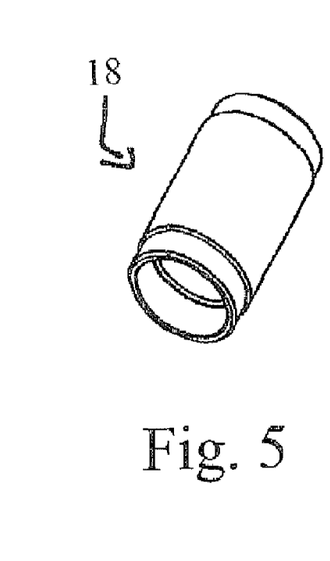
FIG. 5 shows a coupling ring for the calibration standard of FIG. 1 or FIG. 3 in a perspective view.
Figure 6:
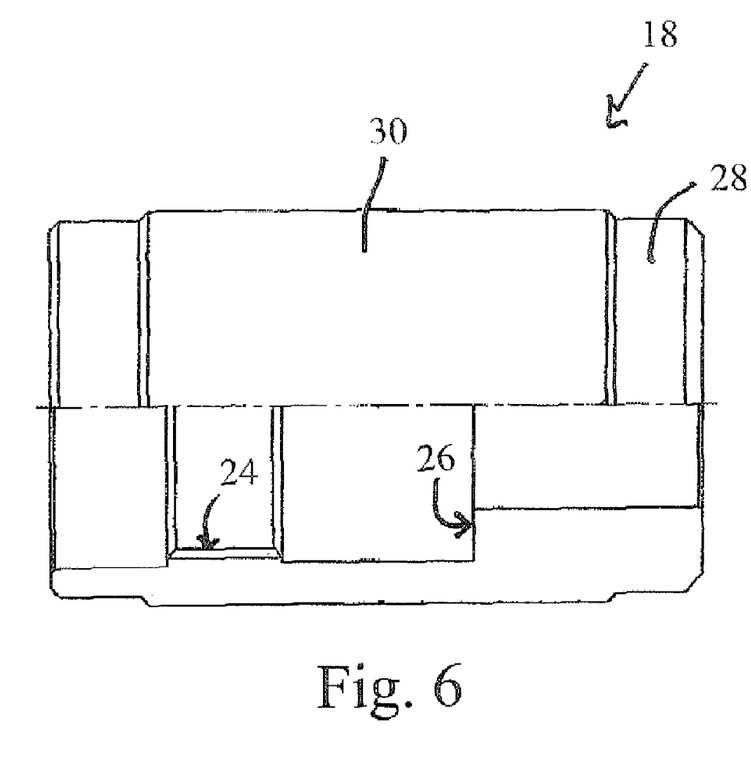
FIG. 6 shows the coupling ring of FIG. 5 in a partially sectional side view.

As can be seen from FIGS. 5 and 6, the fastening nut or coupling ring 18 comprises an internal thread 24 and a stop surface 26 which is formed annular, extending around in the peripheral direction and oriented in the axial direction. At an external side 28, the fastening nut or coupling ring 18 is formed with a knurled surface 30 which simplifies and supports a manual twisting actuation of the fastening nut or coupling ring 18 by a user.

Figure 9:
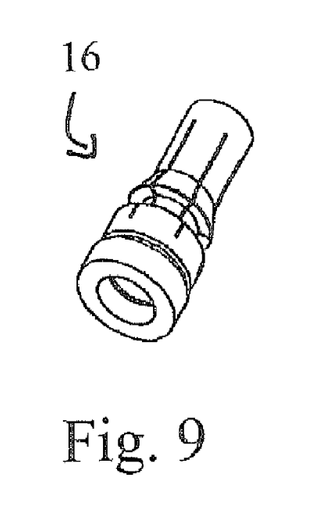
FIG. 9 shows a contact coupling sleeve for the calibration standard of FIG. 1 or FIG. 3 in a perspective view.
Figure 10:
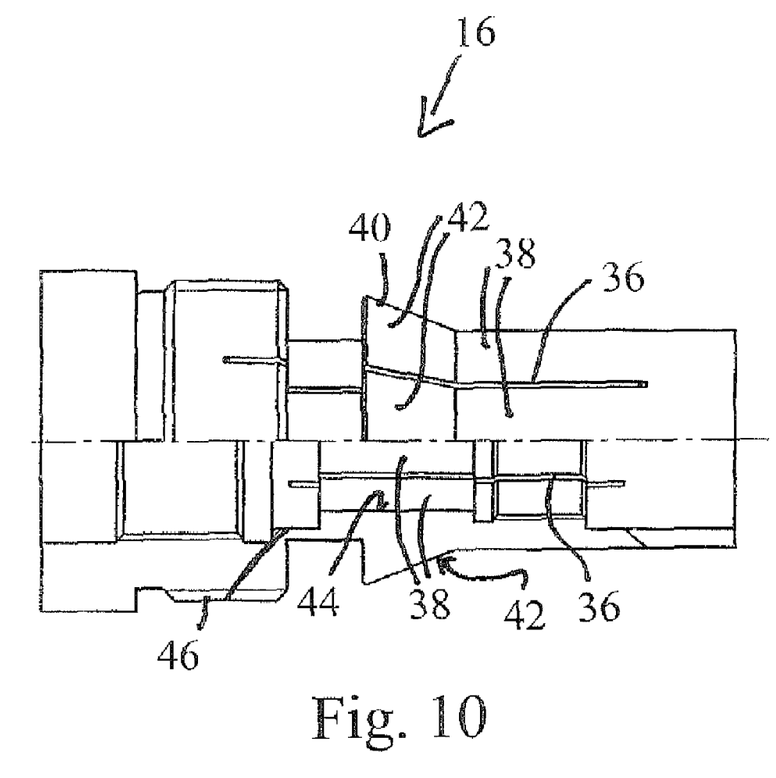
FIG. 10 shows the contact coupling sleeve of FIG. 9 in a partially sectional side view.

As can be seen from FIGS. 9 and 10, the contact coupling sleeve 16 has an axial contact region which has a plurality of slits 36 running in the axial direction and evenly spaced from one another in the peripheral direction. By these slits 36, segments 38 separated from one another are formed in the axial contact region of the contact coupling sleeve 16, the segments being elastically deflectable in the radial direction. Also arranged in the slit axial contact region of the contact coupling sleeve 16 is a conically widening section 40, which forms an inclined surface 42 in each segment 38 on the outside of the contact coupling sleeve 16, whereby on the inside of the contact coupling sleeve 16, opposing each inclined surface 42, a contact surface 44 is provided on each segment 38. Furthermore, the contact coupling sleeve 16 has an external thread 46 on its outer periphery. The internal thread mentioned above of the contact coupling sleeve 16, which is not visible due to the manner of the sectional view, is formed in the region of the slit axial contact region of the contact coupling sleeve.

Figure 7:
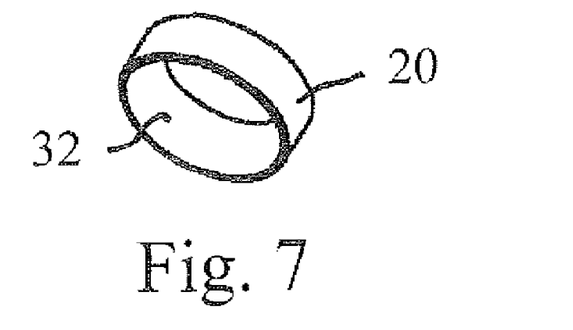
FIG. 7 shows a compression ring for the calibration standard of FIG. 1 or FIG. 3 in a perspective view.
Figure 8:
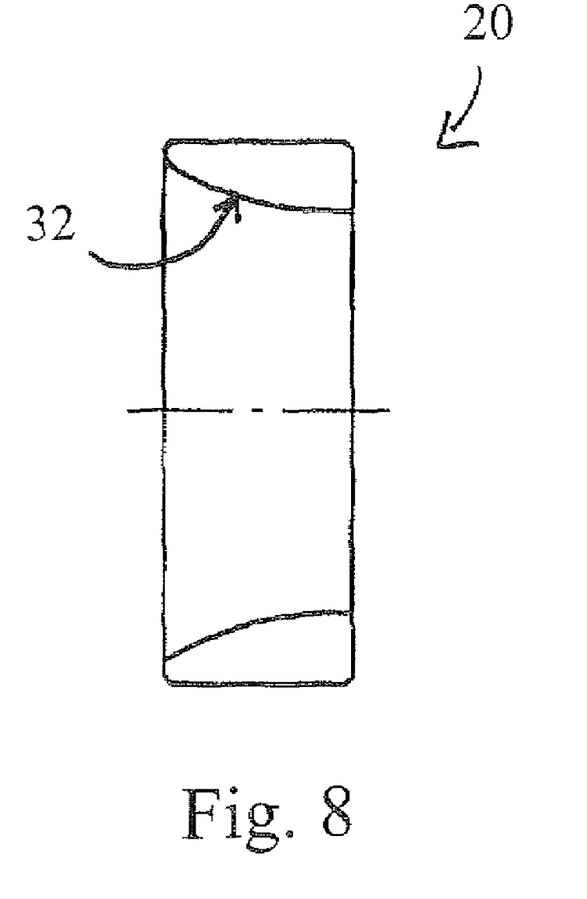
FIG. 8 shows the compression ring of FIG. 7 in a sectional view.

As can be seen from FIGS. 7 and 8, an internal surface 32 of the compression ring 20, whose function will now be described in greater detail, is formed with a rounding, so that an internal diameter of the compression ring 20 varies over its axial extent. The compression ring 20 is arranged between the inclined surfaces 42 of the radially conically widening section 40 of the contact coupling sleeve 16 and the stop surface 26 of the fastening nut or coupling ring 18, such that the internal surface 32 of the compression ring 20 lies against the inclined surfaces 42. Due to the rounded design of the internal surface 32 of the compression ring 20, a sliding contact line in the form of a circular line which is interrupted due to the slits 36 and extends around in the peripheral direction between the internal surface 32 of the compression ring 20 and the inclined surfaces 42 is produced.

The fastening nut or coupling ring 18 is fastened to the contact coupling sleeve 16 by means of a screw thread engagement between the internal thread 24 of the fastening nut or coupling ring 18 and the external thread 46 of the contact coupling sleeve 16. By screwing the fastening nut or coupling ring 18 onto this external thread 46 of the contact coupling sleeve 16, the fastening nut or coupling ring 18 moves in the axial direction relative to the contact coupling sleeve 16, so that an axial distance between the inclined surfaces 42 of the radially conically widening section 40 of the contact coupling sleeve 16 and the stop surface 26 of the fastening nut or coupling ring 18 becomes reduced, so that the stop surface 26 of the fastening nut or coupling ring 18 pushes the compression ring 20 axially onto the inclined surfaces 42. In this way, due to the sliding contact line between the inclined surfaces 42 and the internal surface 32 of the compression ring 20, a force directed in the axial direction is exerted on the inclined surfaces 42, which, due to their inclination, deflect the force into a radially inwardly directed force which acts on the segments 38. By means of this force, with the increasing screwing of the fastening nut or coupling ring 18, the segments 38 are pushed further radially inwardly and, accordingly, radially elastically deflected.

In the region of the contact surfaces 44 which are formed radially inwardly directed on the inside of the contact coupling sleeve 16, the inner conductor part 10 has an annular collar 48 which forms, on its outer periphery, a radially outwardly directed contact surface extending around in the peripheral direction for a short-circuit connection between the outer conductor part 14 and the inner conductor part 10. With increasing radial deflection of the segments 38 on screwing the fastening nut or coupling ring 18 onto the external thread 46 of the contact coupling sleeve 16, the contact surfaces 44 on the inside of the contact coupling sleeve 16 are pressed against the contact surface of the annular collar 48. As a result, an electrical contact is produced between the inner conductor part 10 and the contact coupling sleeve 16 with corresponding contact pressure and corresponding contact area. The contact pressure is created or maintained by the screwed on fastening nut or coupling ring 18. Since the contact coupling sleeve 16, on the other hand, is firmly electrically and mechanically connected to the outer conductor part 14, an electrical short-circuit is produced via the contact coupling sleeve 16 between the outer conductor part 14 and the inner conductor part 10 at the annular collar 48. The electrical short-circuit is reliable and can be made to be repeatable to a sufficient level of quality with the arrangement according to the invention.

The radial deflection of the segments 38 also brings about a corresponding deformation of the internal thread of the contact coupling sleeve 16 formed in the region of said segments 38 for engaging in the external thread of the adjusting screw 12. By this means, on deflection of the segments 38, in addition to the electrical short-circuit contact, the screw thread engagement between the adjusting screw 12 and the contact coupling sleeve 16 is blocked, whereby a mechanically firm connection is made in the region of this thread between the contact coupling sleeve 16 and the adjusting screw 12 or the inner conductor part 10. This mechanical connection is locally separate from the electrical short-circuit contact in the region of the annular collar 48.

In FIGS. 2, 4 and 10, the sectional plane runs exactly through a slit 36 in the contact coupling sleeve 16, so that in the sectional representations, a shaded sectional surface shows only at the axial ends of the contact coupling sleeve 16.

Calibration with the calibration standard according to the invention takes place as follows, by way of example. Determination of the offset between the end face of the inner conductor part and the reference plane (end face of the outer conductor part) at the connector interface (coaxial plug or coaxial socket) of the device to be calibrated. Connection of an offset gauge to the connector interface (coaxial plug or coaxial socket) of the calibration standard. Rotation of the adjusting screw 12 until the desired offset is set at the coaxial coupler of the calibration standard or until the offset gauge shows this desired offset. Rotation of the fastening nut or coupling ring 18 until, through the axial advancing thereof, the compression ring 20 presses the contact surfaces 44 of the segments 38, by means of the inclined surfaces 42, radially against the contact surface of the annular collar 48 of the inner conductor part 10. This produces a precise short-circuit connection between the inner conductor part 10 and the outer conductor part 14 via the contact coupling sleeve 16 and creates a mechanically firm connection between the contact coupling sleeve 16 and the adjusting screw 12 or inner conductor part 10. Furthermore, all the individual parts 10, 14, 16 and 18 are mechanically firmly connected to one another.

The calibration standard according to the invention offers simple use of the adjusting mechanism with a stepless adjusting capability to any desired offset. By equalization of the offset at the connector interface of the device to be calibrated, measuring errors that can arise due to inner conductor gaps are avoided. Only one plug connection exists between the measuring port of the device to be calibrated and the object being measured, that is, the calibration standard. No additional support element is required for the internal conductor in the form of a dielectric, since the contact coupling sleeve 16 performs this supporting function. The functional principle can be transferred to any desired coaxial cross-sections. The inner conductor part 10 is carried out three times, specifically in the short-circuit plane to the external conductor, through the thread connection between the adjusting screw and the contact coupling sleeve 16 and through the pressure that the fastening nut or coupling ring 18 exerts on the annular collar 48. The compression ring 20 is a loose single component with slight rounding on the inside 32. This results in a precisely defined sliding contact with the slit inclined surfaces 40, 42 of the contact coupling sleeve 16. A design of the inside 32 that was straight would be less favorable due to a cutting contact edge or a possible contact over an extended area. Furthermore, this loose sliding connection between the cone 40 and the fastening nut or coupling ring 18 produces the following effect. Until the precise tightening of the fastening nut or coupling ring 18, the sliding compression ring 20 minimizes the torsional forces on the cone 40 and, thereby also, transmission to the inner conductor part 10. If the compression ring 20 and the fastening nut or coupling ring 18 were a fixed unit, this would not be assured. The calibration standard can be rapidly and easily dismantled into all its individual parts. This enables, in advantageous manner, measurement of the conductor diameter over the whole conductor length and thereby ensures traceability to electrical measurement results. Maintenance and repair are also thereby facilitated.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention.
What is claimed is:

1. A coaxial coupling comprising a coaxial airline, having a coaxial plug or a coaxial socket for connecting to a coaxial coupling of a device to be calibrated, wherein said coaxial coupling comprises:
   an inner conductor part and an outer conductor part arranged coaxially therewith, having a short-circuit connection provided between said inner conductor part and said outer conductor part;
   a contact coupling sleeve provided on which said outer conductor part and said inner conductor part are fixed axially displaceable relative to one another, characterizing said connection; and
   a contact mechanism arranged and designed such that said contact mechanism optionally acts on said contact coupling sleeve so that the contact coupling sleeve creates said short-circuit connection in the form of a detachable electrical contact between said inner conductor part and said outer contact part, and simultaneously mechanically fixes said inner conductor part and said outer conductor part in their position relative to one another.

2. The coaxial coupling of claim 1 wherein said coaxial coupling of said device to be calibrated includes a measuring port of a vectorial network analyzer (VNA).

3. The coaxial coupling of claim 1 including having said outer conductor part and said inner conductor part attached to said contact coupling sleeve at an internal periphery of said contact coupling sleeve.

4. The coaxial coupling of claim 1 comprising having said contact coupling sleeve designed to be radially elastically deformable over a predetermined axial contact region, and having at least one contact surface, said coaxial coupling sleeve undetachably mechanically connected to said outer conductor part such that it is undetachably electrically conducting, whereby said inner conductor part has a contact surface which, with said inner conductor part mounted, faces toward said at least one contact surface in the region of said radially elastically deformable axial contact region of said contact coupling sleeve, and wherein said contact mechanism is arranged and designed such that, in order to create the electrical contact between said inner conductor part and said outer conductor part, said contact mechanism optionally radially elastically deforms said contact coupling sleeve and presses the at least one contact surface in the region of said radially elastically deformable axial contact region of the contact coupling sleeve with suitable contact force against said contact surface of said inner conductor part.

5. The coaxial coupling of claim 4 wherein said contact surface comprises an annular collar.

6. The coaxial coupling of claim 5 wherein within said axial contact region said contact coupling sleeve includes at least two slits extending in the axial direction.

7. The coaxial coupling of claim 4 wherein within said axial contact region said contact coupling sleeve includes at least two slits extending in the axial direction.

8. The coaxial coupling of claim 7 wherein said internal thread is formed on said contact coupling sleeve in the region of said axial contact region of said contact coupling sleeve.

9. The coaxial coupling of claim 7 including having said at least two slits evenly spaced from one another in the peripheral direction.

10. The coaxial coupling of claim 9 further including in the region of said at least one contact surface of said axial region of said contact coupling sleeve, said axial contact region of said contact coupling sleeve having at least one inclined surface elevated radially above an outer periphery of said contact coupling sleeve, wherein the contact mechanism comprises a coupling ring which is detachable from said contact coupling sleeve by a screw thread engagement between an external thread on said contact coupling sleeve and an internal thread on said coupling ring, and is fastened to said contact coupling sleeve, movable in the axial direction by a screw motion relative to said contact coupling sleeve, wherein said coupling ring has a stop surface which is arranged and designed such that, on screwing said coupling ring onto said contact coupling sleeve, said stop surface, in cooperation with said at least one inclined surface of said axial contact region of said contact coupling sleeve, elastically deforms said contact coupling sleeve radially inwardly in said axial contact region and presses said at least one contact surface of said axial contact region of said contact coupling sleeve against said contact surface of said inner conductor part.

11. The coaxial coupling of claim 4 further including in the region of said at least one contact surface of said axial region of said contact coupling sleeve, said axial contact region of said contact coupling sleeve having at least one inclined surface elevated radially above an outer periphery of said contact coupling sleeve, wherein the contact mechanism comprises a coupling ring which is detachable from said contact coupling sleeve by a screw thread engagement between an external thread on said contact coupling sleeve and an internal thread on said coupling ring, and is fastened to said contact coupling sleeve, movable in the axial direction by a screw motion relative to said contact coupling sleeve, wherein said coupling ring has a stop surface which is arranged and designed such that, on screwing said coupling ring onto said contact coupling sleeve, said stop surface, in cooperation with said at least one inclined surface of said axial contact region of said contact coupling sleeve, elastically deforms said contact coupling sleeve radially inwardly in said axial contact region and presses said at least one contact surface of said axial contact region of said contact coupling sleeve against said contact surface of said inner conductor part.

12. The coaxial coupling of claim 11 including having said inclined surfaces arranged evenly spaced from one another in a peripheral direction.

13. The coaxial coupling of claim 11 wherein said axial contact region of said contact coupling sleeve includes at least one pair of inclined surfaces lying mutually diametrically opposed, and to which are assigned a pair of correspondingly opposed contact surfaces on an internal side of said contact coupling sleeve.

14. The coaxial coupling of claim 13 including having said inclined surfaces arranged evenly spaced from one another in a peripheral direction.

15. The coaxial coupling of claim 13 including a compression ring arranged between said at least one inclined surface of said axial contact region of said contact coupling sleeve and said stop surface of said coupling ring, said compression ring transmits an axially directed force of said stop surface of said coupling ring onto said at least one inclined surface of said axial contact region of said contact coupling sleeve.

16. The coaxial coupling of claim 11 including a compression ring arranged between said at least one inclined surface of said axial contact region of said contact coupling sleeve and said stop surface of said coupling ring, said compression ring transmits an axially directed force of said stop surface of said coupling ring onto said at least one inclined surface of said axial contact region of said contact coupling sleeve.

17. The coaxial coupling of claim 16 wherein an internal surface of said compression ring faces towards said at least one inclined surface of said axial contact section of said contact coupling sleeve, and is formed with a rounding so that an internal diameter of said compression ring increases from an end of said compression ring facing towards said stop surface of said coupling ring to an end of said compression ring facing towards said at least one inclined surface of said axial contact region of said contact coupling sleeve.

18. The coaxial coupling of claim 1 including having a screw engagement fastening between said contact coupling sleeve and said inner conductor part between an external thread on said inner conductor part and an internal thread on said contact coupling sleeve.

19. The coaxial coupling of claim 18 wherein said internal thread is formed on said contact coupling sleeve in the region of said axial contact region of said contact coupling sleeve.

20. A method for calibrating a device having a coaxial coupling connection comprising:
    determining an offset between an end face of an inner conductor part of said coaxial coupling and a reference plane or end face of an outer conductor part of said coaxial coupling at a coaxial plug or coaxial socket of said device to be calibrated;
    connecting an offset gauge to said coaxial plug or coaxial socket;
    rotating an adjusting screw until a predetermined offset is set at said coaxial coupling or until said offset gauge shows said predetermined offset;
    rotating a fastening nut or coupling ring until, through an axial advancing thereof, a compression ring presses contact surfaces of said coaxial coupling segments through inclined surfaces, radially against a contact surface of an annular collar of said inner conductor part;
    forming a short-circuit connection between said inner conductor part and said outer conductor part by a contact coupling sleeve; and
    creating a mechanically firm connection between said contact coupling sleeve and said adjusting screw or inner conductor part.

* * * * *